United States Patent
Friedrich et al.

(10) Patent No.: US 7,800,389 B2
(45) Date of Patent: Sep. 21, 2010

(54) INTEGRATED CIRCUIT HAVING BUILT-IN SELF-TEST FEATURES

(75) Inventors: Andreas P. Friedrich, Metz-Tessy (FR); Andrea Foletto, Annecy (FR); P. Karl Scheller, Bow, NH (US); Paul David, Bow, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 597 days.

(21) Appl. No.: 11/777,406

(22) Filed: Jul. 13, 2007

(65) Prior Publication Data
US 2009/0019330 A1 Jan. 15, 2009

(51) Int. Cl.
*G01R 31/26* (2006.01)
(52) U.S. Cl. .................. 324/763; 324/765
(58) Field of Classification Search .......... None
See application file for complete search history.

(56) References Cited

U.S. PATENT DOCUMENTS

| | | | |
|---|---|---|---|
| 3,816,766 A * | 6/1974 | Anselmo et al. ............ 327/187 |
| 5,412,255 A | 5/1995 | Wallrafen |
| 6,448,802 B1 * | 9/2002 | Hirt ............................ 324/765 |
| 6,891,431 B2 * | 5/2005 | Beer et al. ..................... 330/6 |
| 2003/0085729 A1 | 5/2003 | Binkley et al. |
| 2005/0024075 A1 | 2/2005 | Srivastava |
| 2007/0063690 A1 | 3/2007 | De Wilde et al. |

FOREIGN PATENT DOCUMENTS

| EP | 0 582 071 A2 | 2/1994 |
|---|---|---|
| WO | WO/2006/056829 | 6/2006 |

OTHER PUBLICATIONS

PCT Search Report and Written Opinion of the ISA for PCT/US2008/065731 dated Oct. 21, 2008.
PCT International Preliminary Report on Patentability and Written Opinion of the ISA for PCT/US2008/065731 filed on Jun. 4, 2008.

* cited by examiner

*Primary Examiner*—Minh N Tang
(74) *Attorney, Agent, or Firm*—Daly, Crowley, Mofford & Durkee, LLP (57) ABSTRACT

An integrated circuit includes a sensor for providing a sensor output signal and a diagnostic circuit coupled to the sensor for providing a self-diagnostic signal. The self-diagnostic signal comprises the sensor output signal during a first time duration and an inverted sensor output signal during a second different time duration.

25 Claims, 6 Drawing Sheets

INTEGRATED CIRCUIT HAVING BUILT-IN SELF-TEST FEATURES

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to integrated circuits and, more particularly, to integrated circuits that have built-in self-test features.

BACKGROUND OF THE INVENTION

As is known, some integrated circuits have internal built-in self-test (BIST) capabilities. A built-in self-test is a function that can verify all or a portion of the internal functionality of an integrated circuit. Some types of integrated circuits have built-in self-test circuits built directly onto the integrated circuit die. Typically, the built-in self-test is activated by external means, for example, a signal communicated from outside the integrated circuit to dedicated pins or ports on the integrated circuit. For example, an integrated circuit that has a memory portion can include a built-in self-test circuit, which can be activated by a self-test signal communicated from outside the integrated circuit. The built-in self-test circuit can test the memory portion of the integrated circuit in response to the self-test signal.

Conventional built-in self-test circuits do not allow the integrated circuit to perform its intended function while the built-in self-test is being performed. Instead, during the built-in self-test, the built-in self-test circuit exercises all of, or parts of, circuits on the integrated circuit in particular ways that do not necessarily allow concurrent operation of functions that the integrated circuit is intended to perform. Therefore, the built-in self-test is typically only activated one time, for example, upon power up of the integrated circuit, or from time to time. At other times, the built-in self-test circuit and function are dormant and the integrated circuit can perform its intended function.

SUMMARY OF THE INVENTION

In accordance with one aspect of the present invention, an integrated circuit includes a sensor for providing a sensor output signal and a diagnostic circuit coupled to the sensor for providing a self-diagnostic signal. The self-diagnostic signal comprises the sensor output signal during a first time period and an inverted sensor output signal during a second different time period.

In accordance with another aspect of the present invention, a circuit method in an integrated circuit includes, from a sensor, generating a sensor output signal. The method also includes generating a self-diagnostic signal. The self-diagnostic signal comprises the sensor output signal during a first time period and an inverted sensor output signal during a second different time period.

With these arrangements, an integrated circuit can provide an output signal representative of the self-diagnostic signal. The output signal has signal characteristics indicative of a properly functioning integrated circuit, or alternatively, signal characteristics that are indicative of a failure of the integrated circuit.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "sensor" is used to describe a device able to provide and output signal indicative of n physical characteristic. Some types of sensors are transducers, able to convert from one type of energy to another.

While electronic devices having three device nodes are shown in figures below, wherein one of the nodes is an output node, it should be recognized that, in some other embodiments, two nodes can also be used instead of three. For these embodiments, one of the nodes has a dual purpose. For example, one node can provide a power supply voltage to the device and the device can draw a varying current from the same node to provide the output signal.

Figure 1:
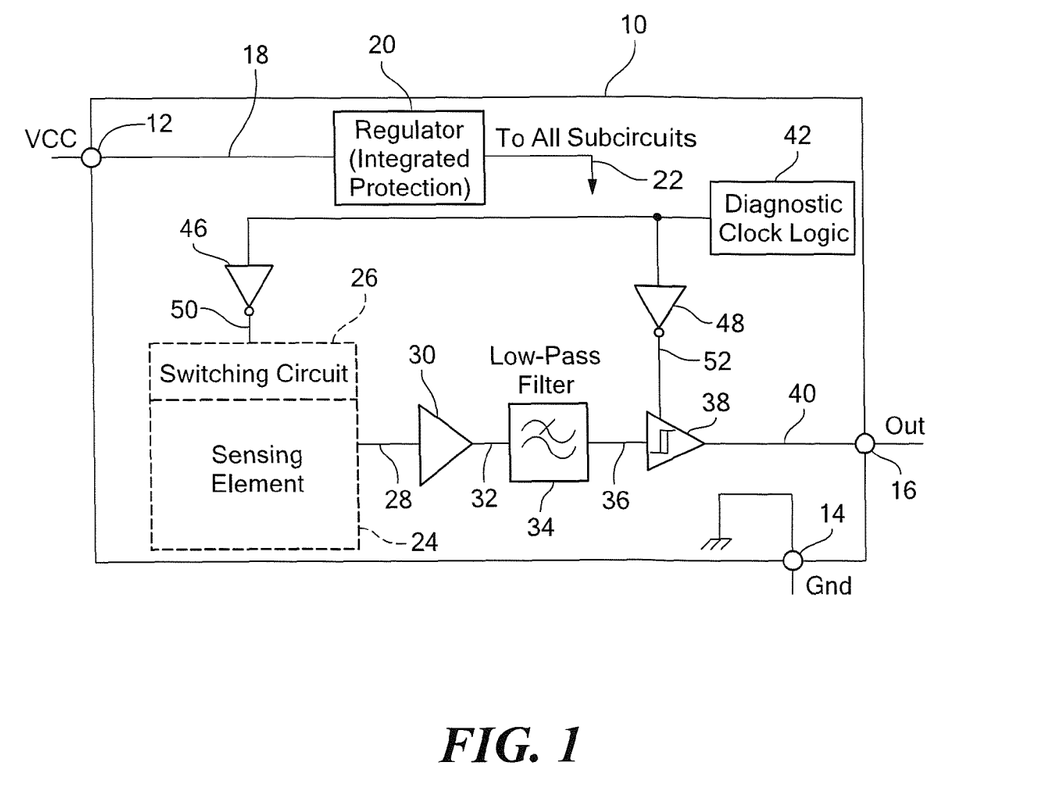
FIG. 1 is a block diagram showing an integrated circuit having built-in self-test features in accordance with the present invention.

Referring to FIG. 1, an exemplary integrated circuit 10 includes a power node 12, a ground node 14, and an output node 16. The integrated circuit 10 can also include a voltage regulator 20 coupled to receive a power supply voltage (Vcc) 18 from the power node 12. The voltage regulator 20 can be configured to generate a regulated voltage 22 to the various circuits within the integrated circuit 10.

The integrated circuit 10 includes a sensing element 24 (or sensor), which can be, for example, a magnetic field sensing element, including, but not limited to, a Hall effect element or a magnetoresistance element. However, other types of sensors can also be used. For example, the sensing element 24 can also be a pressure sensor, a light sensor, a strain sensor, or a temperature sensor.

The sensing element 24 generates a sensor output signal (not shown). The sensing element 24 in combination with a switching circuit 26 generate a self-diagnostic signal 28 having characteristics described more fully below.

The integrated circuit 10 can include an amplifier 30, which can be one or more amplifiers, and which may or may not include an automatic gain control, offset adjustment, chopper stabilization, and/or other signal processing features. The amplifier 30 is coupled to receive the self-diagnostic signal 28 and is configured to generate an amplified signal 32. The integrated circuit 10 can also include one or more filters 34, for example, low pass filters 34, which are coupled to receive the amplified signal 32, and which are configured to generate a filtered signal 36.

The integrated circuit 10 can also include a comparator circuit 38 coupled to receive the filtered signal 36 and configured to generate an output signal 40 at the output node 16.

The integrated circuit 10 can also include a diagnostic logic circuit 42, which can, for example, be an oscillator. The oscillator 42 can generate a clock signal 44 having first and second states with different durations.

The integrated circuit 10 can also include a circuit module 46 and a circuit module 48, which can be inverting circuit modules, and which can be coupled to receive the clock signal 44, and which can be configured to generate respective clock signals 50, 52, which are received by the switching circuit 26 and by the comparator circuit 38, respectively.

Figure 2:
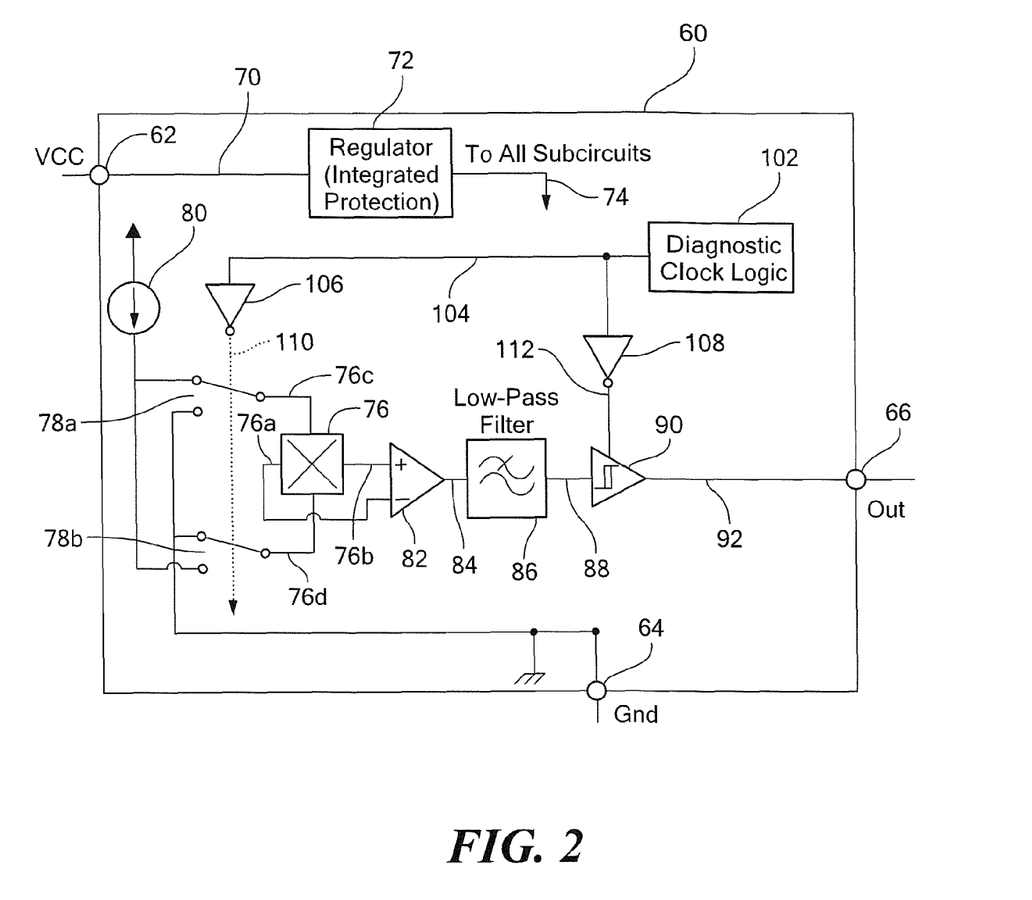
FIG. 2 is a block diagram showing a particular embodiment of the integrated circuit of FIG. 1.

Referring now to FIG. 2, an integrated circuit 60 includes a power node 62, a ground node 64, and an output node 66. The integrated circuit 60 can include a voltage regulator 72 coupled to receive a power supply voltage (Vcc) 70 from the power node 62. The voltage regulator 72 can be configured to generate a regulated voltage 74 to the various circuits within the integrated circuit 60.

The integrated circuit 60 includes a sensing element 76, here shown to be a Hall element 76. While the sensing element 76 is shown to be a Hall element, it should be appreciated that a variety of other types of sensors can be used in place of the Hall element 76, including sensors that are not disposed upon the integrated circuit 60, but which are coupled to the integrated circuit 60 at other nodes (not shown). Other types of sensors are described above in conjunction with FIG. 1.

The sensing element 76 generates a differential sensing element output signal 76a, 76b, which, as will become apparent from discussion below, can be a self-diagnostic signal. A switching circuit 78a, 78b can be coupled to provide a drive signal 76c, 76d to the sensing element 76. Operation of the switching circuit 78a, 78b is described more fully below.

The integrated circuit 60 can include an amplifier 82, which can be one or more amplifiers, and which may or may not include an automatic gain control, offset adjustment, chopper stabilization, and/or other signal processing features. The amplifier 82 is coupled to receive the differential sensing element output signal 76a, 76b (or self-diagnostic signal) and is configured to generate an amplified signal 84.

The integrated circuit 60 can also include one or more filters 86, for example, low pass filters 86, which are coupled to receive the amplified signal 84, and which are configured to generate a filtered signal 88.

The integrated circuit 60 can also include a comparator circuit 90 coupled to receive the filtered signal 88 and configured to generate an output signal 92 at the output node 66. The comparator circuit 90 can have two thresholds (not shown, first and second thresholds), a difference between which corresponds to a hysteresis. The first and second thresholds can have first and second threshold values, respectively, or third and fourth threshold values, respectively, in accordance with the two states of the clock signal 112.

As used herein the term "operate point" (OP) is used to describe a magnetic field (BOP) to which the sensing element 76 is subjected, which corresponds to the first (upper) one of the two thresholds, and which is referred to herein as the first or BOP threshold. As used herein the term "release point" (RP) is used to describe a magnetic field (BRP) to which the sensing element 76 is subjected, which corresponds to a second (lower) one of the two thresholds, which is referred to herein as the second or BRP threshold. The BOP and BRP threshold each have respective threshold values.

The integrated circuit 60 can also include a diagnostic logic circuit 102, which can, for example, be an oscillator. The oscillator 102 can generate a clock signal 104 having first and second states with different durations.

The integrated circuit 60 can also include a circuit module 106 and a circuit module 108, which can be inverting circuit modules, which can be coupled to receive the clock signal 104, and which can be configured to generate respective clock signals 110, 112, which are received by a switching circuit 78a, 78b and by the comparator circuit 90, respectively.

The integrated circuit 60 can further include a current source 80 coupled to the sensor 76 through the switching circuit 78a, 78b.

In operation, the clock signal 110 can cause the switching circuit 78a, 78b to achieve a first switched position when the clock signal 110 is in the first state and to achieve a second switched position when the clock signal 110 is in the second state. In the first switched position, current from the current source 80 flows through the sensor 76 in one direction, and in the second switched position, current from the current source 80 flows through the sensor 76 in the other direction. The switching circuit 78a, 78b causes the sensor 76 to generate a non-inverted sensor output signal 76a, 76b when the switching circuit 78a, 78b is in the first switched position and to generate an inverted sensor output signal 76a, 76b when the switching circuit 78a, 78b is in the second switched position. As discussed below, presence of the inverted sensor output signal can result in an indication of a properly functioning integrated circuit.

In some embodiments, described more fully below in conjunction with FIG. 5, the BOP and BRP thresholds associated with the comparator circuit 90 have first and second predetermined threshold values and are not affected by the clock signal 112. It will become apparent from the discussion of FIG. 5 below that this arrangement of the BOP and BRP thresholds results in the integrated circuit 60 functioning as a latch.

In some other embodiments, the clock signal 112 can cause the comparator circuit 90, and in particular, the BOP and BRP thresholds (not shown), associated with the comparator circuit 90, to have either first and second threshold values or third and fourth different threshold values according to the two states of the clock signal 112. The first and second thresholds achieve first and second threshold values, respectively, in response to the clock signal 112 being in the first state, and the first and second thresholds achieve third and fourth different threshold values, respectively, in response to the clock signal 112 being in the second state. It will become apparent from the discussion of FIG. 4 below that this arrangement of the BOP and BRP thresholds results in the integrated circuit 60 functioning as a switch.

As used herein, the term "quiescent sensor output signal value" ($V_q$) is used to describe an output from the sensor 76 when the sensor 76 is in the presence of no operational magnetic field, but may be in the presence of the earth's magnetic field. In some embodiments, for which the Vcc voltage at the power node 12 is 5.0 Volts, the quiescent sensor output signal value, $V_q$, is a differential voltage signal 76a, 76b of approximately 2.5 Volts.

In some arrangements, the above-described first threshold value (associated with the BOP threshold) is a first predetermined amount above the quiescent sensor output signal value, $V_q$, (e.g., at 3.5 Volts), the above-described second threshold value (associated with the BRP threshold) is a second predetermined amount above the quiescent sensor output signal value, $V_q$, (e.g., at 3.0 Volts), the above-described third threshold value (associated with the BOP threshold at another position) is approximately the second predetermined amount below the quiescent sensor output signal value, $V_q$, (e.g., at 2.0 Volts), and the above-described fourth threshold value (associated with the BRP threshold at a new position) is approximately the first predetermined amount below the quiescent sensor output signal value, $V_q$, (e.g., at 1.5 Volts). In some other arrangements, the first, second, third, and fourth predetermined amounts can be relative to some DC voltage other than the quiescent sensor output signal value, $V_q$. Movement of the BOP and BRP thresholds will become more apparent from the discussion below in conjunction with FIGS. 4 and 5.

In some arrangements, the amplifier 82 can be biased such that, if the sensing element 76 is removed (or broken), the amplified voltage 84 can shift, for example, near to zero volts.

The integrated circuit 60 can be used in applications in which the magnetic field experienced by the sensor 76 is zero Gauss (or only the earths' magnetic field) at some times, and some other magnetic field at other times, as would be produced, for example, by a permanent magnet at times distal from and at other times proximate to the sensor 76. One such application is an automotive application, for which the integrated circuit 60 is used to detect a position of an automobile part, for example, a gear shift lever, near to which it is disposed, and which has a permanent magnet disposed upon the lever. For these applications, the above-described first and second thresholds can be arranged to provide a switch, as described below, for example, in conjunction with FIG. 4.

The integrated circuit 60 can be also used in applications in which the magnetic field experienced by the sensor 76 is in one direction at some times, and in the opposite direction at other times, as would be produced, for example, by a rotating ring magnet proximate to the sensing element 76, which has segments alternately polarized about the circumference of the ring magnet. One such application is for detection of a rotation of an automobile power window motor. For these applications, the above-described first and second thresholds can be arranged to provide a latch, as described below, for example, in conjunction with FIG. 5.

Figure 3:
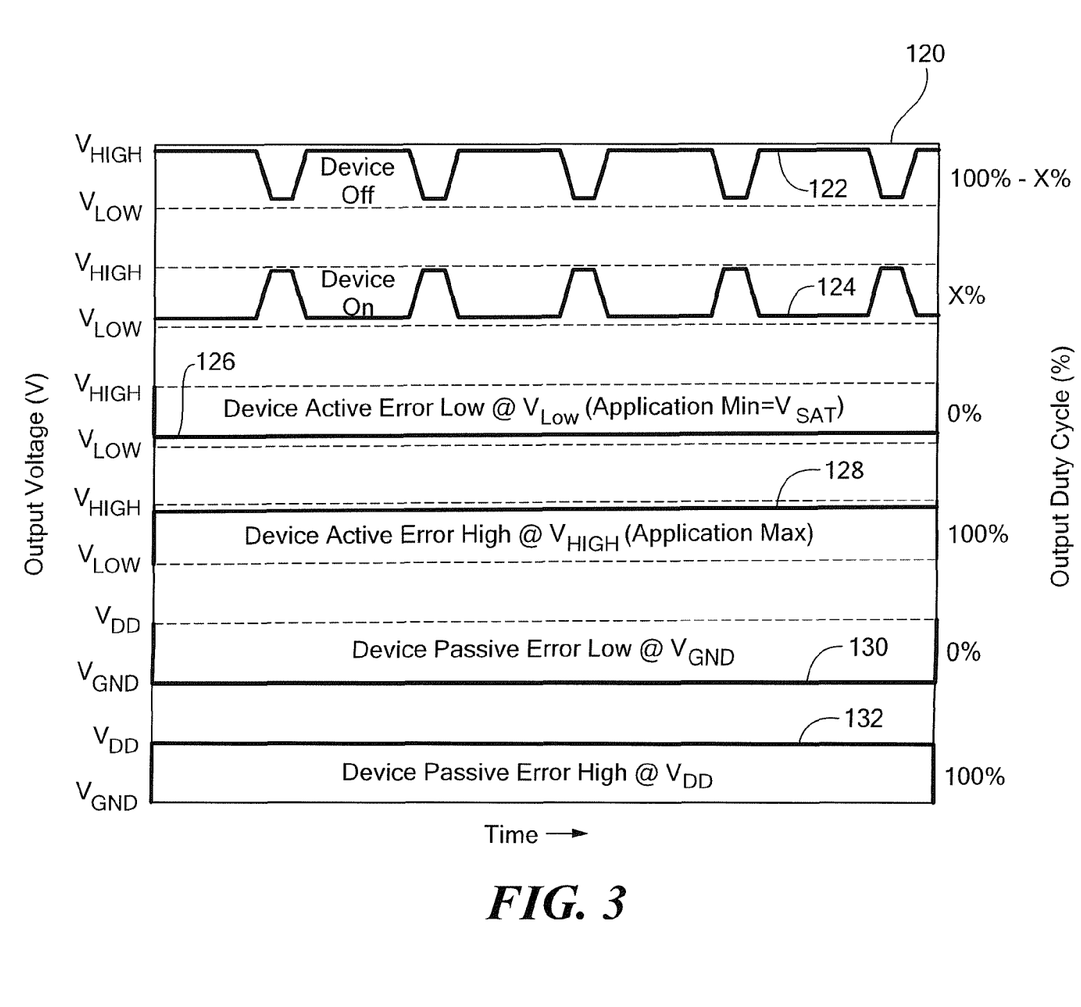
FIG. 3 is a graph showing outputs from the integrated circuit of FIG. 2, some outputs indicative of a properly functioning integrated circuit and other outputs indicative of a failure of the integrated circuit.

Referring now to FIG. 3, a graph 120 includes a left vertical axis having units of voltage in arbitrary units, a horizontal axis having units of time in arbitrary units, and a right axis having units indicative of duty cycle in percent.

Signals 122-132 are indicative of different output signals 92 (FIG. 2) that may be achieved, for example, at the output node 66 of the integrated circuit 60 of FIG. 2, when the above-described BOP and BRP thresholds are arranged to cause the integrated circuit 60 of FIG. 2 to act as a switch. This particular arrangement of the BOP and BRP thresholds is described more fully below in conjunction with FIG. 4.

The signal 122 is indicative of the output signal 92 at the output node 66 when the integrated circuit 60 (FIG. 2) is functioning properly and when the sensor 76 (FIG. 2) is experiencing no magnetic field (or only the earth's magnetic field). The signal 122 has high states and low states in accordance with switching caused by the clock signals 110 and 112 of FIG. 2. The high and low states have different durations. The longer duration states, the high states, of the signal 122 are representative of an "operational mode" of the integrated circuit 60, and are indicative of the integrated circuit 60 of FIG. 2 being "off," meaning that the sensor 76 is experiencing no magnetic field, or only the earth's magnetic field. The shorter duration states, the low states, of the signal 122 are indicative of a "diagnostic mode" of the integrated circuit 60, during which time, the sensor output signal 76a, 76b (FIG. 2) is inverted. The low states are, however, also indicative of the integrated circuit 60 of FIG. 2 being "off," since they are merely an inverted version of the high states. In some embodiments, the high states of the signal 122 can be less than the full regulated voltage 74 (FIG. 2) (e.g., approximately 0.5 Volts below the regulated voltage 74) and/or the low states of the signal 122 can be higher than ground (e.g., approximately 0.5 Volts above ground).

The signal 124 is indicative of the output signal 92 at the output node 66 when the integrated circuit 60 (FIG. 2) is functioning properly and when the sensor 76 (FIG. 2) is experiencing a magnetic field (which can include the earth's magnetic field), for example, a magnetic field generated by a permanent magnet proximate to the sensor 76 of FIG. 2. The signal 122 has high states and low states in accordance with switching caused by the clock signals 110 and 112 of FIG. 2. The high and low states have different durations. The longer duration states, the low states, of the signal 124 are representative of the operational mode of the integrated circuit 60, and are indicative of the integrated circuit 60 of FIG. 2 being "on," meaning that the sensor 76 is experiencing a magnetic field of at least a particular strength, for example, from a permanent magnet. The shorter duration states, the high states, of the signal 124 are indicative of the diagnostic mode of the integrated circuit 60, during which time, the sensor output signal 76a, 76b (FIG. 2) is inverted. The high states are, however, also indicative of the integrated circuit 60 of FIG. 2 being "on," since they are merely an inverted version of the low states. In some embodiments, the high states of the signal 124 can be less than the regulated voltage 74 (FIG. 2) (e.g., approximately 0.5 Volts below the regulated voltage 74) and/or the low states of the signal 124 can be higher than ground (e.g., approximately 0.5 Volts above ground).

It should be apparent that transitions of the signals 122 and 124 are coincident with transitions of the clock signal 104 of FIG. 2.

It should be apparent that the longer duration states of the signals 122, 124 are representative of the output signal 92 that would be generated by the integrated circuit 60 if the integrated circuit 60 did not include the switching circuit 78a, 78b or the diagnostic clock logic module 102. In contrast, the shorter duration states of the signals 122, 124 are indicative of the output signal 92 that is generated by the integrated circuit 60 because of the switching circuit 78a, 78b and the diagnostic clock logic module 102, during which time, the sensor output signal 76a, 76b (FIG. 2) is inverted. Stated differently, the shorter duration states are representative of the diagnostic mode of operation. However, it is the entire switching nature of the signals 122 and 124 that is representative of a properly functioning integrated circuit.

In some embodiments, the shorter duration states occupy about fifteen percent of a cycle of the signals 122, 124, and therefore, the duty cycle of the signal 122 is about eighty-five (100-15) percent and the duty cycle of the signal 124 is about fifteen percent in accordance with the left hand axis of the graph 120. However, the duty cycle of the shorter duration states can be any percentage, including, percentages greater than fifty percent (in which case they would be the longer duration states), so long as they can be distinguished from the other duration states.

With this arrangement, in which the sensor signal 76a, 76b is periodically inverted, it is more likely that a failure of the integrated circuit 60 can be detected. This is because the switching results in many of the circuit portions of the integrated circuit 60 being exercised, which exercising indicates that the integrated circuit 60 is functioning properly, without failure.

The signal 126, a static low state, is indicative of the output signal 92 at the output node 66 when the integrated circuit 60 (FIG. 2) is experiencing a failure. It should be apparent from signals 122, 124, that, when operating properly, the integrated circuit 60 has one of the two output signals 122, 124, which continually switch between high and low states. Any non-switching output signal is indicative of a failure. In some embodiments, the low state of the signal 126 can be higher than ground (e.g., approximately 0.5 Volts above ground).

Similarly, the signal 128, a static high state, is indicative of the output signal 92 at the output node 66 of the integrated circuit 60 (FIG. 2), when the integrated circuit 60 is experiencing a failure. The high state of the signal 128 can be indicative of the same failure as the low state of signal 126, or it can be indicative of a different failure. In some embodiments, the high state of the signal 128 can be less than the full regulated voltage 74 (see FIG. 2) (e.g., approximately 0.5 Volts below the regulated voltage 74).

The signals 126 and 128 can be indicative of failures within the integrated circuit 60 of FIG. 2. This is in contrast to the signals 130 and 132 described below, which can be indicative of other types of failures of the integrated circuit 60, or of failures (i.e., short circuits or open circuits) in wires that couple the integrated circuit 60 to other circuits.

The signal 130, a static low state, is indicative of the output signal 92 at the output node 66 of the integrated circuit 60 (FIG. 2), when the integrated circuit 60, or when wiring that couples the integrated circuit 60 to other circuits, is experiencing a failure. In some embodiments, the low state of the signal 130 can be at or near ground.

Similarly, the signal 132, a static high state, is indicative of the output signal 92 at the output node 66 of the integrated circuit 60 (FIG. 2), when the integrated circuit 60, or when wiring that couples the integrated circuit 60 to other circuits, is experiencing a failure. In some embodiments, the high state of the signal 132 can be at or near the regulated voltage 74 (FIG. 2), or at some other voltage, for example, Vcc (FIG. 2).

Figure 4:
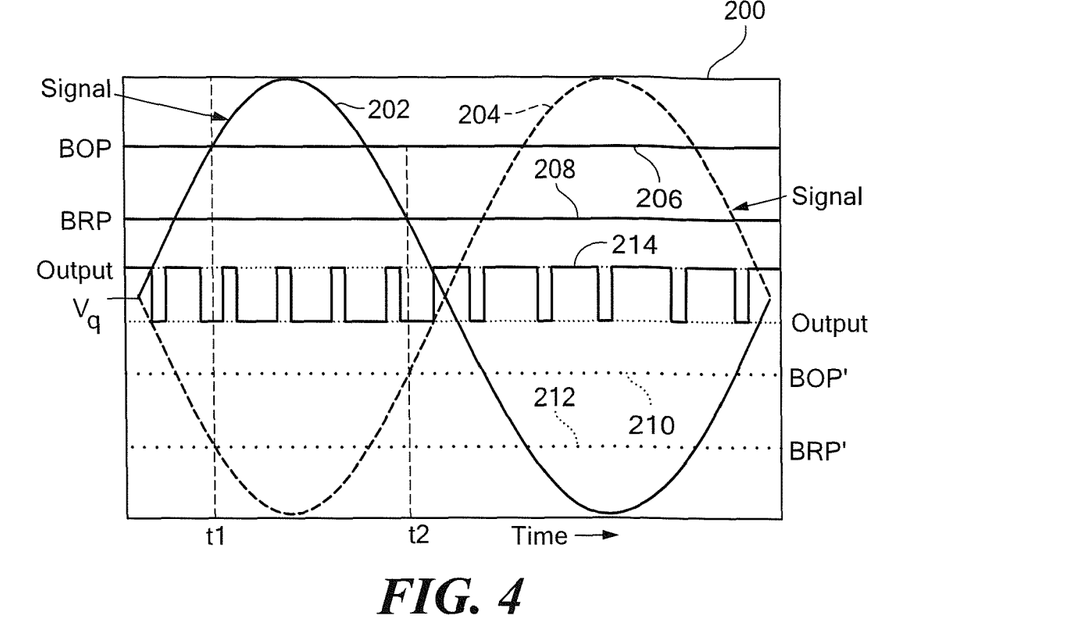
FIG. 4 is a graph showing further details of operation of the integrated circuit of FIG. 2 when configured as a switch.

Referring now to FIG. 4, a graph 200 includes a vertical axis having units of voltage in arbitrary units and a horizontal axis having units of time in arbitrary units. Various signals are shown in the graph 200.

A signal 202 is representative of a non-inverted signal, for example, the differential sensor signal 76a, 76b of FIG. 2, or the amplified signal 84 of FIG. 2, or the filtered signal 88 of FIG. 2, when the switching circuit 78a, 78b is in the above-described first switched position, which results in a non-inverted sensing element output signal 76a, 76b. A signal 204 is representative of an inverted signal, for example, the differential signal 76a, 76b of FIG. 2, or the amplified signal 84 of FIG. 2, or the filtered signal 88 of FIG. 2, when the switching circuit 78a, 78b is in the above-described second switched position, which results in an inverted sensing element output signal 76a, 76b.

As discussed above, the switching circuit 78a, 78b of FIG. 2 causes the direction of current through the sensor 76 to reverse direction periodically, resulting in corresponding reversals of polarity, i.e., inversions, of the sensing element output signal 76a, 76b. Thus, the sensing element output signal 76a, 76b will at times be provided by the signal 202 and at other times be provided by the signal 204, which results in vertical transitions from one such signal to the other. The vertical transitions are omitted from most of the signals in FIG. 4 for clarity. It should be recognized that the vertical transitions occur upon transitions of the clock signal 104 of FIG. 2. Switching to the inverted signal 204 has a shorter duration that the switching to the non-inverted signal, and therefore, the inverted signal 204 is shown as a dashed line.

Both of the signals 202, 204 have a "zero crossing" not at zero volts, but at the above-described sensor quiescent sensor output signal value, labeled here as $V_q$. Thus, the signal 202 is representative of a magnetic field in proximity to the sensor 76 of FIG. 2 in one direction as the signal 202 increases above the quiescent sensor output signal value, $V_q$, and of a magnetic field in proximity to the sensor 76 of FIG. 2 in the opposite direction as the signal 202 decreases below the quiescent sensor output signal value, $V_q$. Where the signal 202 achieves the value of $V_q$, the sensor 76 of FIG. 2 is experiencing no magnetic field (or only the earth's magnetic field).

In some applications, it should be recognized that the magnetic field does not reverse direction. Instead, a magnet moves proximate to the sensor 76 of FIG. 2 or away from the sensor 76 of FIG. 2, as would occur, for example if the integrated circuit 60 of FIG. 2 were used to detect position of a gear shift lever in an automobile. In these applications, it should be apparent that the graph 200 describes operation of the integrated circuit 60 as a switch, which changes state as the magnetic field increases, and which changes state again when the magnetic field decreases back toward the quiescent sensor output signal value, $V_q$.

As described above, the signals 202 and 204 are representative of a magnetic field first in one direction and then in another direction at the Hall element 76 of FIG. 2, in a sinusoidal fashion.

BOP and BRP thresholds having first and second threshold values 206, 208, respectively, are shown. The BOP and BRP thresholds have first and second threshold values, 206, 208, respectively, when the sensing element output signal 76a, 76b is provided by the non-inverted signal 202. BOP and BRP thresholds having third and fourth threshold values 210, 212, respectively, are also shown (which are represented by prime symbols in BOP' and BRP'). The BOP and BRP thresholds have the third and fourth threshold values 210, 212, respectively, when the sensing element output signal 76a, 76b is provided by the inverted signal 204. The BOP and BRP thresholds switch back and forth from the first and second threshold values 206, 208, respectively to the third and fourth threshold values 210, 212, respectively, in accordance with the states of the clock signal (e.g., 112, FIG. 2).

Signals 202 and 204 as well as the BOP and BRP threshold values 206, 208, 210, 212 are shown with arbitrary voltage scalings. However the relative scaling of the signals 202, 204 with the BOP and BRP threshold values 206, 208, 210, 212 is indicative of exemplary relative scaling.

An output signal 214 (e.g., 92, FIG. 2) switches back and forth (vertical transitions are shown) between two states in accordance with the clock signal 110 of FIG. 2. The signal 214 is shown on an arbitrary voltage scale for clarity, unrelated to the voltage scales of the other signals. Between times t1 and t2, the output signal 214 has a low duty cycle and is similar to the signal 122 of FIG. 3. After the time t2, the output signal 214 has a higher duty cycle and is similar to the signal 124 of FIG. 3.

As described above, the switching of the output signal 214 is indicative a properly functioning integrated circuit.

As described above, in some arrangements, the amplifier 82 of FIG. 2 can be biased such that, if the sensing element 76 is removed (or broken), the amplified signal 84 can shift, for example, near to zero volts. In this case, the output signal 214 (92 of FIG. 2) will cease to switch, which is indicative of a failure of the integrated circuit 60 of FIG. 3. The output signal 214 can also cease to switch in the event of other failures, for example, a failure of other elements of the integrated circuit 60 of FIG. 2.

Figure 5:
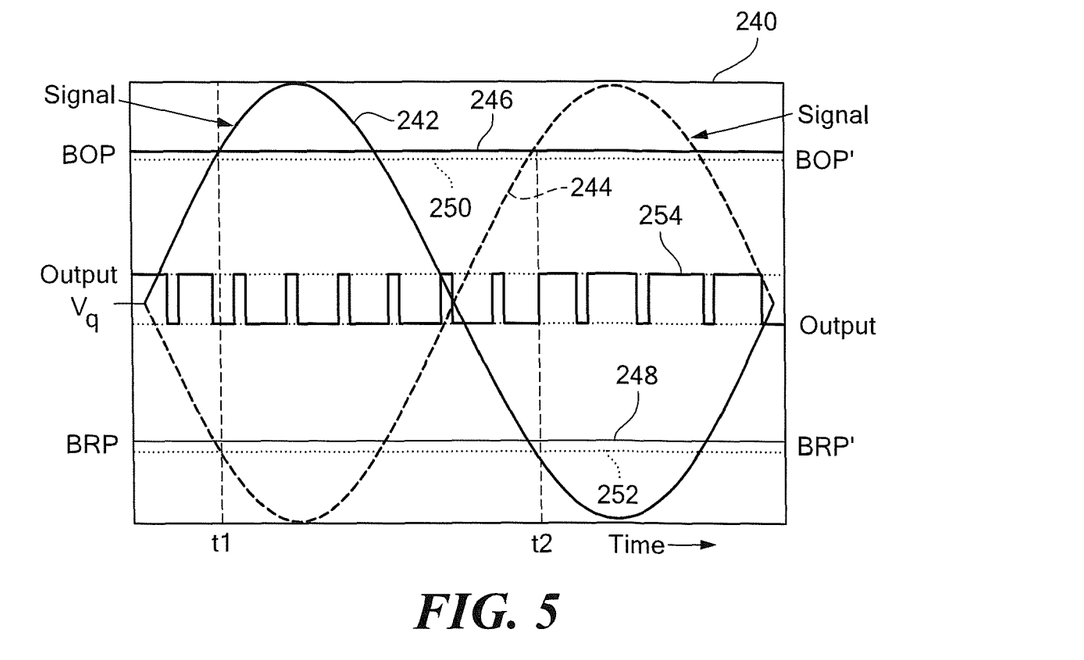
FIG. 5 is a graph showing further details of operation of the integrated circuit of FIG. 2 when configured as a latch.

Referring now to FIG. 5, a graph 240 includes a vertical scale in units of voltage in arbitrary units and a horizontal scale in units of time in arbitrary units. Various signals are shown in the graph 240. Vertical transitions are omitted from the various signals for clarity.

A signal 242 is representative of a non-inverted signal, for example, the differential signal 76a, 76b of FIG. 2, or the amplified signal 84 of FIG. 2, or the filtered signal 88 of FIG. 2, when the switching circuit 78a, 78b is in the above-described first switched position, which results in a non-inverted sensing element output signal 76a, 76b. A signal 244 is representative of an inverted signal, for example, the differential signal 76a, 76b of FIG. 2, or the amplified signal 84 of FIG. 2, or the filtered signal 88 of FIG. 2, when the switching circuit 78a, 78b is in the above-described second switched position, which results in an inverted sensing element output signal 76a, 76b.

As discussed above, the switching circuit 78a, 78b of FIG. 2 causes the direction of current through the sensor 76 to reverse direction periodically, resulting in corresponding reversals of polarity, i.e., inversions, of the sensing element output signal 76a, 76b. Thus, the sensing element output signal 76a, 76b will at times be provided by the signal 242 and at other times be provided by the signal 244, which results in vertical transitions from one such signal to the other. The vertical transitions are omitted from most of the signals in FIG. 5 for clarity. It should be recognized that the vertical transitions occur upon transitions of the clock signal 104 of FIG. 2. Switching to the inverted signal 204 has a shorter duration that the switching to the non-inverted signal, and therefore, the inverted signal 244 is shown as a dashed line.

Both of the signals 242, 244 have a "zero crossing," not at zero volts, but at the above described sensor quiescent sensor output signal value, labeled here as $V_q$. Thus, the signal 242 is representative of a magnetic field in proximity to the sensor 76 of FIG. 2 in one direction as the signal 242 increases above the quiescent sensor output signal value, $V_q$, and of a magnetic field in proximity to the sensor 76 of FIG. 2 in the opposite direction as the signal 242 decreases below the quiescent sensor output signal value, $V_q$. Where the signal 242 achieves the value of $V_q$, the sensor 76 of FIG. 2 is experiencing no magnetic field (or only the earth's magnetic field).

As described above, in some applications, it should be recognized that the magnetic field does not reverse direction. Instead, a magnet moves proximate to the sensor 76 of FIG. 2 or away from the sensor 76 of FIG. 2, as would occur, for example if the integrated circuit 60 of FIG. 2 were used to detect position of a gear shift lever in an automobile. In these applications, it should be apparent that the graph 240 describes operation of the integrated circuit 60 as a latch (not a switch as in FIG. 4) which changes state as the magnetic field increases, and which does not change state again when the magnetic field decreases back toward the sensor quiescent sensor output signal value, $V_q$. However, in some applications, for example, the above-described application that uses a rotating segmented ring magnet in proximity to the sensor 76 of FIG. 2, the magnetic field experienced by the sensor 76 does reverse in direction.

BOP and BRP thresholds having first and second threshold values 246, 248, respectively, are shown. The BOP and BRP thresholds have first and second threshold values, 246, 248, respectively, when the sensing element output signal 76a, 76b is provided by the non-inverted signal 242. BOP and BRP thresholds having third and fourth threshold values 250, 252, respectively, are also shown (which are represented by prime symbols in BOP' and BRP'). The BOP and BRP thresholds have the third and fourth threshold values 250, 252, respectively, when the sensing element output signal 76a, 76b is provided by the inverted signal 244. The BOP and BRP thresholds switch back and forth from the first and second threshold values 246, 248, respectively to the third and fourth threshold values 250, 252, respectively, in accordance with the states of the clock signal (e.g., 112, FIG. 2).

In some arrangements, the movement of the first and second threshold values to the third and fourth threshold values of both FIGS. 4 and 5 can be achieved by a two-step process. Initially, the first and second thresholds, BOP, BRP, respectively, are positioned at first and second threshold values. As a first step, the first and second thresholds are moved to intermediate threshold values that are mirror images of the initial threshold values about the sensor quiescent sensor output signal value, $V_q$. Referring first to FIG. 4, the first and second threshold values 206, 208 are mirrored about $V_q$. The movement will result in the BOP and BRP threshold values 210, 212 being below the sensor quiescent sensor output signal value, $V_q$, but at positions interchanged from those shown. As a second step, the first and second threshold values are interchanged, resulting in the BOP and BRP threshold values 210, 212, respectively, as shown. The same two steps can provide the threshold values of FIG. 5, which essentially do not move.

Signals 242 and 244 as well as the BOP and BRP threshold values 246, 248, 250, 252 are shown with arbitrary voltage scales. However the relative scaling of the signals 242, 244 with the BOP and BRP threshold values 246, 248, 250, 252 is indicative of exemplary relative scaling.

An output signal 254 (e.g., 92, FIG. 2) switches back and forth (vertical transitions are shown) between two states in accordance with the clock signal 110 of FIG. 2. The signal 254 is shown on an arbitrary voltage scale for clarity, unrelated to the voltage scales of the other signals. Between times t1 and t2, the output signal 254 has a low duty cycle and is similar to the signal 122 of FIG. 3. After the time t2, the output signal 254 has a higher duty cycle and is similar to the signal 124 of FIG. 3.

In the above-described applications, in which the magnetic field does not reverse direction, other means can be used to cause the integrated circuit 60 of FIG. 2 to reverse state once latched. For example, the integrated circuit can be powered off then back on again, or circuits can be used to reset the state with a manual pushbutton or the like.

As described above, the switching of the output signal 254 is indicative of a properly functioning integrated circuit. For the latch arrangement of FIG. 5, it should be understood that the output signal 254 ceases to switch, if, for example, the sensor output signal 76a, 76b of FIG. 2 is stuck at the sensor quiescent sensor output signal value, $V_q$. Thus, the arrangement of the BOP and BRP thresholds of FIG. 5 results in an integrated circuit that can provide an output signal from which it is possible to identify faults in the sensing element 76 of FIG. 3.

As described above, in some arrangements, the amplifier 82 of FIG. 2 can be biased such that, if the sensing element 76 is removed (or broken), the amplified signal 84 can shift, for example, near to zero volts. In this case, the output signal 254 (92 of FIG. 2) will cease to switch, which is indicative of a failure of the integrated circuit 60 of FIG. 2. The output signal 254 can also cease to switch in the event of other failures, for example, a failure of other elements of the integrated circuit 60 of FIG. 2.

Figure 6:
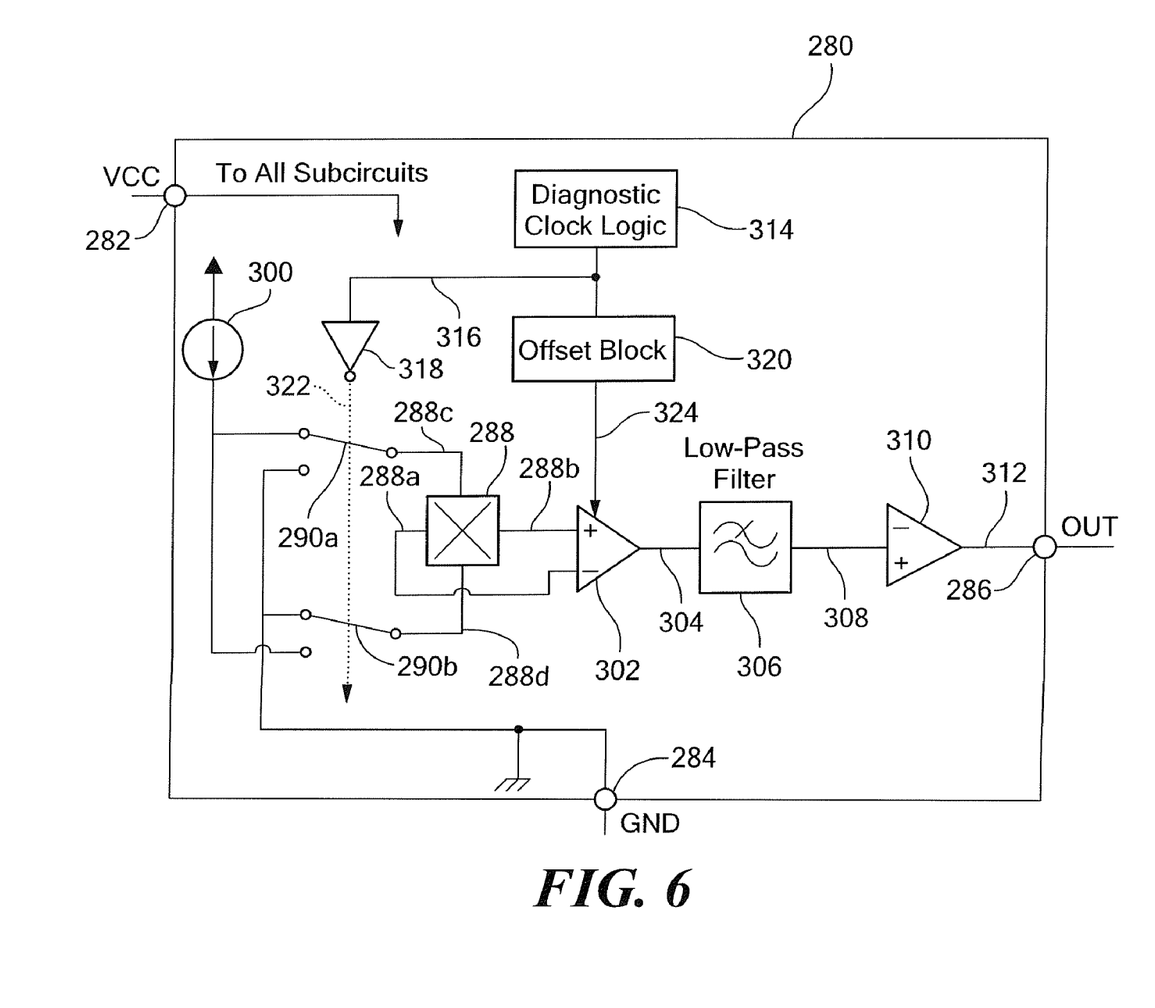
FIG. 6 is a block diagram showing another particular embodiment of an integrated circuit having some characteristics of the integrated circuit of FIG. 2.

Referring now to FIG. 6, an integrated circuit 280 includes a power node 282, a ground node 284, and an output node 286. Unlike the integrated circuits 10 and 60 of FIGS. 1 and 2, respectively, the integrated circuit 280 provides an analog output signal, as will become apparent.

The integrated circuit 280 includes a sensing element 288, here shown to be a Hall element 288. While the sensing element 288 is shown to be a Hall element, it should be appreciated that a variety of other types of sensors can be used in place of the Hall element 288, including sensors that are not disposed upon the integrated circuit 280, but which are coupled to the integrated circuit 280 at other nodes (not shown). Other types of sensors are described above in conjunction with FIG. 1.

The sensing element 288 generates a differential sensing element output signal 288a, 288b, which, as will become apparent from discussion below, can be a self-diagnostic signal. A switching circuit 290a, 290b can be coupled to provide a drive signal 288c, 288d to the sensing element 288. Operation of the switching circuit 288a, 288b is described more fully below.

The integrated circuit 288 can include an amplifier 302, which can be one or more amplifiers, and which may or may not include an automatic gain control, offset adjustment, chopper stabilization, and/or other signal processing features. The amplifier 302 is coupled to receive the differential sensor signal 288a, 288b (or self-diagnostic signal) and is configured to generate an amplified signal 304.

The integrated circuit 280 can also include one or more filters 306, for example, low pass filters 306, which are coupled to receive the amplified signal 304, and which are configured to generate a filtered signal 308.

The integrated circuit 288 can also include an amplifier 310 coupled to receive the filtered signal 308 and configured to generate an output signal 312 at the output node 286. Unlike the circuits 10 and 60 of FIGS. 1 and 2, respectively, the integrated circuit 280 includes no comparator, and therefore, the output signal 312 is an analog output signal.

The integrated circuit 280 can also include a diagnostic logic circuit 314, which can, for example, be an oscillator. The oscillator 314 can generate a clock signal 316 having first and second states with different durations.

The integrated circuit 280 can also include a circuit module 318, which can be an inverting circuit module, which can be coupled to receive the clock signal 316, and which can be configured to generate a clock signal 322, which is received by a switching circuit 290a, 290b.

The integrated circuit 280 can also include an offset block (or offset module) 320 coupled to receive the clock signal 316 and configured to provide an offset signal 324 having an offset value to the amplifier 302 during one of the two states of the clock signal 316.

The integrated circuit 280 can further include a current source 300 coupled to the sensor 288 though the switching circuit 290a, 290b.

In operation, the clock signal 322 can cause the switching circuit 290a, 290b to achieve a first switched position when the clock signal 322 is in the first state and to achieve a second switched position when the clock signal 322 is in the second state. In the first switched position, current from the current source 300 flows through the sensor 288 in one direction, and in the second switched position, current from the current source 300 flows through the sensor 288 in the other direction. The switching circuit 290a, 290b and resulting current flow reversals causes the sensor 288 to generate a non-inverted sensor output signal 288a, 288b when the switching circuit 290a, 290b is in the first switched position and to generate an inverted sensor output signal 288a, 288b when the switching circuit 290a, 290b is in the second switched position. As discussed above, presence of the inverted sensor output signal can result in an indication of a properly functioning integrated circuit.

In some embodiments, described more fully below in conjunction with FIG. 7, the offset module 320 generates the offset signal 324 with an offset signal value during only one of the two states of the clock signal 316, for example, during the second state. The offset signal 324 with the offset value can be generated, for example, when the switching circuit 290a, 290b achieves the second switched position, during which time the sensing element 288 generates the above-described inverted sensor output signal 288a, 288b. Therefore, the offset signal 304 is added to the inverted sensor output signal 288a, 288b, but not to the non-inverted sensor output signal 288a, 288b achieved when the switching circuit 290a, 290b is in the first switched position.

The integrated circuit 280 can be used in applications in which the magnetic field experienced by the sensor 288 is zero Gauss (or only the earths' magnetic field) at some times, and some other varying magnetic field at other times, as would be produced, for example, by a permanent magnet moving toward the sensor 288. One such application is an automotive application, for which the integrated circuit 280 is used to detect a position of a automobile part near to which it is disposed, for example, a gear shift lever, which has a permanent magnet disposed upon the lever.

The integrated circuit 280 can be also used in applications in which the magnetic field experienced by the sensor 288 is varying in one direction at some times, and varying in the opposite direction at other times, as would be produced, for example, by a rotating ring magnet proximate to the sensing element 288 having segments alternately polarized about the circumference of the ring magnet. One such application is for detection of a rotation of an automobile wheel, as would be used in and anti-lock braking system (ABS).

Figure 7:
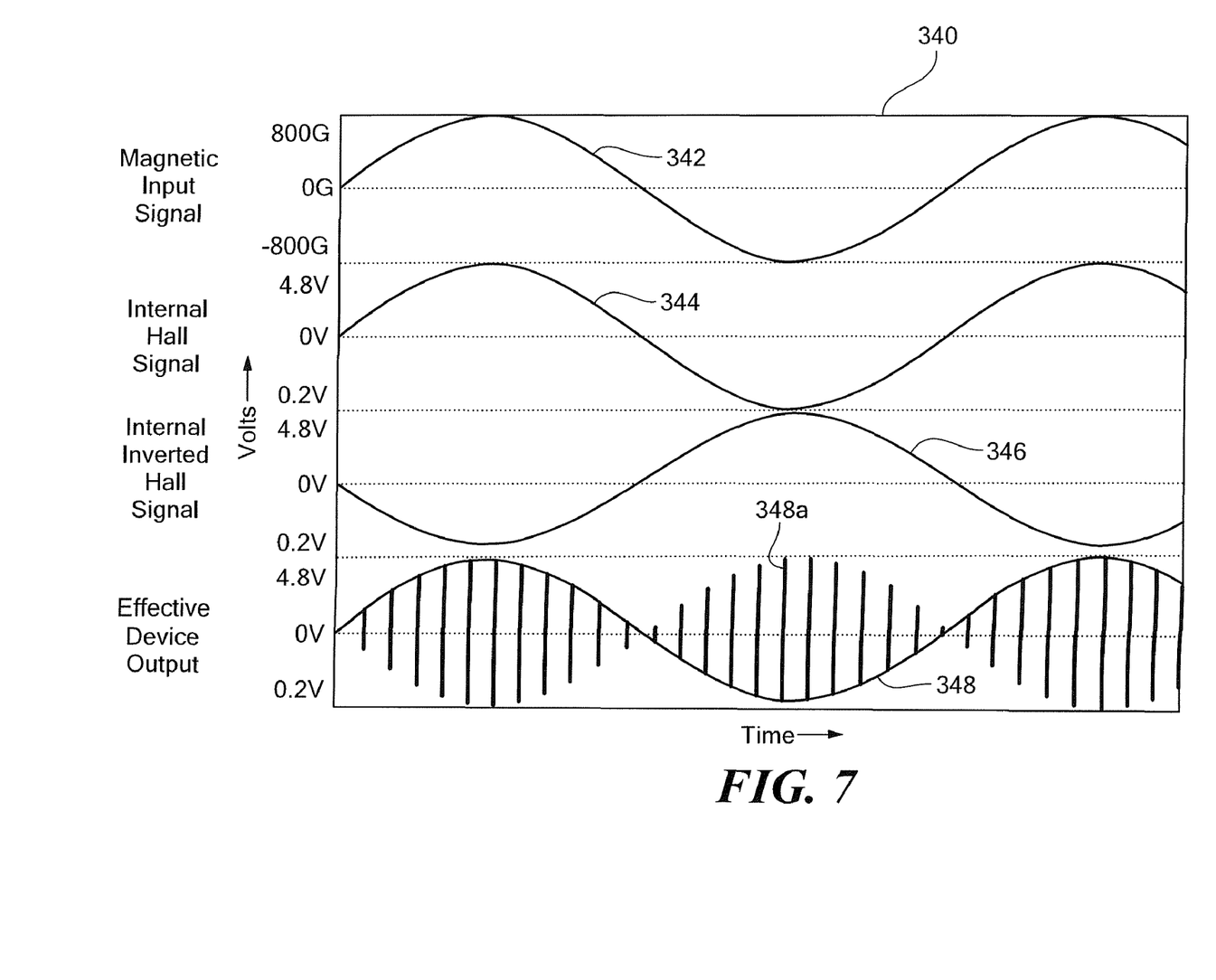
FIG. 7 is a graph showing inputs to and an output from the integrated circuit of FIG. 6.

Referring now to FIG. 7, a graph 340 includes a vertical scale with several ranges, a first (upper) range in units of magnetic field in Gauss and second through fourth ranges in units of voltage in volts. The graph 340 also includes a horizontal scale in units of time in arbitrary units.

A signal 342 is representative of a magnetic field that may be experienced, for example, by the sensor 288 of FIG. 6. The magnetic field signal 342 reaches a peak in one direction, then reaches a peak in the other direction, and so on.

A signal 344 is representative of the differential sensing element output signal 288a, 288b of FIG. 6 (a non-inverted signal), if the switching circuit 290a, 290b of FIG. 6 were fixed in the first switched position. A signal 346 is representative of the differential sensing element output signal 288a, 288b of FIG. 6 (an inverted signal), if the switching circuit 290a, 290b of FIG. 6 were fixed in the second switched position. However, it should be appreciated that the integrated circuit 280 of FIG. 6, neither of the signals 344 or 346 exists as a continuous signal as shown. The signal 346 includes a small offset voltage (barely visible) as would be generated by the offset block 320 of FIG. 6. The signal 344 does not include the offset voltage.

A signal 348 is representative of a signal that switches between the signals 344 and 346, in response to the clock signal 316 of FIG. 6. The signal 348 is representative of the amplified signal 304 of FIG. 6, the filtered signal 308 of FIG. 6, or the output signal 312 of FIG. 6.

The signal 348, which switches between the signals 344 and 346, is indicative of a properly functioning integrated circuit (e.g., 280, FIG. 6). In particular, the small offset voltage, which is present during the shorter switching durations (e.g., 348a) of the signal 346, is indicative of proper operation of the integrated circuit 280 at least back to the amplifier 302. If the output signal 348 (312 of FIG. 6) had no such switching, then the output signal 348 would be indicative of a failure of the integrated circuit.

In some arrangements, the amplifier 302 of FIG. 6 can be biased such that, if the sensing element 288 is removed (or broken), the amplified signal 304 can shift, for example, near to zero volts. In this case, the output signal 348 will cease to switch, which is indicative of a failure of the integrated circuit 280 of FIG. 6. The output signal 348 can also cease to switch in the event of other failures, for example, a failure of other elements of the integrated circuit 280 of FIG. 6.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. An integrated circuit, comprising:
   a sensor for providing a sensor output signal; and
   a diagnostic circuit coupled to the sensor for providing a self-diagnostic signal, wherein the self-diagnostic signal comprises the sensor output signal during a first time duration and an inverted sensor output signal during a second different time duration.

2. The integrated circuit of claim 1, wherein the inverted sensor signal includes a DC offset signal.

3. The integrated circuit of claim 1, wherein the sensor comprises a magnetic field sensor including an input port and including an output port at which the sensor output signal is provided.

4. The integrated circuit of claim 1 wherein the diagnostic circuit comprises:
   an oscillator for providing an oscillator output signal having first and second states, wherein the first and second states of the oscillator output signal have unequal time durations; and
   a switching circuit coupled to the sensor and to the oscillator, wherein the switching circuit achieves a first switched position when the oscillator output signal is in the first state, and wherein the switching circuit achieves a second switched position when the oscillator output signal is in the second state, wherein the switching circuit is configured to cause the sensor to generate the sensor output signal when in the first switched position, and wherein the switching circuit is configured to cause the sensor to generate the inverted sensor output signal when in the second switched position.

5. The integrated circuit of claim 4, wherein the sensor comprises a magnetic field sensor including an input port and including an output port at which the sensor output signal is provided.

6. The integrated circuit of claim 4, further comprising a comparator circuit coupled to receive a comparator circuit input signal representative of the self-diagnostic signal, the comparator circuit for providing a comparator circuit output signal, wherein the comparator circuit output signal has a first state in response to the self-diagnostic signal provided as the sensor output signal, and wherein the comparator circuit output signal has a second state in response to the self-diagnostic signal provided as the inverted sensor signal.

7. The integrated circuit of claim 6, wherein the comparator circuit comprises a first threshold and a second threshold, wherein a difference between the first and second thresholds corresponds to a hysteresis.

8. The integrated circuit of claim 7, wherein the sensor comprises a magnetic field sensor including an output port at which the sensor output signal is provided.

9. The integrated circuit of claim 7, wherein the first and second thresholds achieve first and second threshold values, respectively, in response to the oscillator output signal being in the first state, and wherein the first and second thresholds achieve third and fourth threshold values, respectively, in response to the oscillator output signal being in the second state, wherein the third and fourth threshold values are generated by mirroring the first and second threshold values about a predetermined DC value, respectively, to achieve first and second intermediate threshold values and then interchanging the first and second intermediate threshold values.

10. The integrated circuit of claim 7, wherein the comparator circuit also comprises a control node coupled to receive the oscillator output signal, wherein the first and second thresholds achieve first and second threshold values, respectively, in response to the oscillator output signal being in the first state, and wherein the first and second thresholds achieve third and fourth threshold values, respectively, in response to the oscillator output signal being in the second state.

11. The integrated circuit of claim 10, wherein the sensor comprises a magnetic field sensor including an output port at which the sensor output signal is provided.

12. The integrated circuit of claim 10, wherein the sensor output signal comprises a quiescent sensor output signal value, wherein the first threshold value is a first predetermined amount above the quiescent sensor output signal value, wherein the second threshold value is a second predetermined amount above the quiescent sensor output signal value, wherein the third threshold value is approximately the second predetermined amount below the quiescent sensor output signal value, and wherein the fourth threshold value is approximately the first predetermined amount below the quiescent sensor output signal value.

13. The integrated circuit of claim 1, wherein the first and second time durations repeat periodically.

14. A circuit method in an integrated circuit, comprising:
   from a sensor, generating a sensor output signal; and
   generating a self-diagnostic signal comprising the sensor output signal during a first time duration and comprising an inverted sensor output signal during a second different time duration.

15. The method of claim 14, further comprising, adding a DC offset signal to the inverted sensor signal.

16. The method of claim 14, wherein the sensor comprises a magnetic field sensor including an input port and including an output port at which the sensor output signal is provided.

17. The method of claim 14, wherein the generating the self-diagnostic signal comprises:
   from an oscillator, generating an oscillator output signal having first and second states, wherein the first and second states of the oscillator output signal have unequal time durations; and
   communicating the oscillator output signal to a switching circuit coupled to the sensor and to the oscillator, wherein the switching circuit achieves a first switched position when the oscillator output signal is in the first state, and wherein the switching circuit achieves a second switched position when the oscillator output signal is in the second state;

generating the sensor output signal when the switching circuit is in the first switched position; and generating the inverted sensor output signal when the switching circuit is in the second switched position.

18. The method of claim 17, wherein the sensor comprises a magnetic field sensor including an input port and including an output port at which the sensor output signal is provided.

19. The method of claim 17, further comprising:

generating first and second thresholds, wherein a difference between the first and second thresholds corresponds to a hysteresis;

comparing a signal representative of the self-diagnostic signal to the first and second thresholds; and generating a comparison output signal in accordance with the comparing, wherein the comparison output signal has a first state in response to the self-diagnostic signal provided as the sensor output signal, and wherein the comparison output signal has a second state in response to the self-diagnostic signal provided as the inverted sensor signal.

20. The method of claim 19, wherein the sensor comprises a magnetic field sensor including an input port and including an output port at which the sensor output signal is provided.

21. The method of claim 19, wherein the generating the first and second thresholds compromises:

generating the first and second thresholds with first and second threshold values, respectively, in response to the oscillator output signal being in the first state; and generating the first and second thresholds with third and fourth threshold values, respectively, in response to the oscillator output signal being in the second state, wherein the generating the third and fourth threshold values comprises:

mirroring the first and second threshold values about a predetermined DC value, respectively, to achieve first and second intermediate threshold values; and interchanging the first and second intermediate threshold values.

22. The method of claim 19, wherein the generating the first and second thresholds comprises:

generating the first and second thresholds with first and second threshold values, respectively, in response to the oscillator output signal being in the first state; and generating the first and second thresholds with third and fourth threshold values, respectively, in response to the oscillator output signal being in the second state.

23. The method of claim 22, wherein the sensor comprises a magnetic field sensor including an input port and including an output port at which the sensor output signal is provided.

24. The method of claim 22, wherein the sensor output signal comprises a quiescent sensor output signal value, and wherein the generating the first and second thresholds further comprises generating the first threshold value a first predetermined amount above the quiescent sensor output signal value;

generating the second threshold value a second predetermined amount above the quiescent sensor output signal value;

generating the third threshold value approximately the second predetermined amount below the quiescent sensor output signal value; and generating the fourth threshold value approximately the first predetermined amount below the quiescent sensor output signal value.

25. The method of claim 14, wherein the first and second time durations repeat periodically.

* * * * *

UNITED STATES PATENT AND TRADEMARK OFFICE
CERTIFICATE OF CORRECTION

| | | |
|---|---|---|
| PATENT NO. | : 7,800,389 B2 | Page 1 of 1 |
| APPLICATION NO. | : 11/777406 | |
| DATED | : September 21, 2010 | |
| INVENTOR(S) | : Andreas P. Friedrich et al. | |

It is certified that error appears in the above-identified patent and that said Letters Patent is hereby corrected as shown below:

Col. 2, line 33, delete "and" and replace with -- an --.

Col. 2, line 34, delete "n" and replace with -- a --.

Col. 3, line 61, delete "generate" and replace with -- generates --.

Col. 5, line 21, delete "earths'" and replace with -- earth's --.

Col. 8, line 2, delete "that" and replace with -- than --.

Col. 8, line 61, delete "a" and replace with -- of a --.

Col. 9, line 33, delete "that" and replace with -- than --.

Col. 9, line 36, delete "above described" and replace with -- above-described --.

Col. 12, line 21, delete "earths'" and replace with -- earth's --.

Col. 12, line 26, delete "a automobile" and replace with -- an automobile --.

Col. 12, line 37, delete "and" and replace with -- an --.

Col. 12, line 54, delete "that the" and replace with -- that in the --.

Col. 15, line 26, delete "compromises:" and replace with -- comprises: --.

Col. 16, line 20, delete "comprises" and replace with -- comprises: --.

Signed and Sealed this
Twenty-ninth Day of March, 2011

David J. Kappos
*Director of the United States Patent and Trademark Office*